United States Patent
Jatou et al.

(10) Patent No.: US 8,126,402 B1
(45) Date of Patent: Feb. 28, 2012

(54) TRANSMISSION LINE COMMON-MODE FILTER

(75) Inventors: Ross F. Jatou, San Jose, CA (US); Chen Wang, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 727 days.

(21) Appl. No.: 11/566,914

(22) Filed: Dec. 5, 2006

(51) Int. Cl.
*H04B 1/00* (2006.01)

(52) U.S. Cl. .......................................... 455/63.1; 455/73

(58) Field of Classification Search ................. 455/63.1, 455/73
See application file for complete search history.

(56) References Cited

U.S. PATENT DOCUMENTS

| | | | | |
|---|---|---|---|---|
| 3,815,137 | A * | 6/1974 | Kaegebein | 370/339 |
| 5,181,423 | A * | 1/1993 | Philipps et al. | 73/724 |
| 5,386,214 | A * | 1/1995 | Sugawara | 343/700 MS |
| 6,211,698 | B1 * | 4/2001 | Suh | 326/60 |
| 7,456,650 | B2 * | 11/2008 | Lee | 326/30 |
| 2002/0184544 | A1 * | 12/2002 | Svestka et al. | 713/320 |
| 2003/0058062 | A1 * | 3/2003 | Remillard | 333/99 S |
| 2004/0243871 | A1 * | 12/2004 | Nieuwland et al. | 713/401 |
| 2004/0257173 | A1 * | 12/2004 | Luque | 333/204 |
| 2005/0043055 | A1 * | 2/2005 | Vance | 455/550.1 |
| 2005/0070232 | A1 * | 3/2005 | Mages | 455/78 |
| 2005/0215204 | A1 * | 9/2005 | Wallace et al. | 455/78 |
| 2006/0009185 | A1 * | 1/2006 | Shamsaifar et al. | 455/278.1 |
| 2006/0126745 | A1 * | 6/2006 | Haq et al. | 375/257 |
| 2006/0186970 | A1 * | 8/2006 | Shi et al. | 333/176 |
| 2007/0205822 | A1 * | 9/2007 | Jovanovich et al. | 327/526 |
| 2007/0218844 | A1 * | 9/2007 | Alanen et al. | 455/73 |

* cited by examiner

*Primary Examiner* — Nay A Maung
*Assistant Examiner* — Erica Fleming-Hall
(74) *Attorney, Agent, or Firm* — Patterson & Sheridan, LLP

(57) ABSTRACT

One embodiment of the invention sets forth a technique for using a resonator as a common-mode filter for attenuating unwanted common-mode frequencies in a differential signal. Filtering these unwanted frequencies may reduce electromagnetic interference from the differential signal pair in nearby electronic devices. Since common-mode filtering is employed, the resonator reduces the unwanted common-mode noise at specific frequencies without distorting the information-carrying differential signals. Further, since the filter is implemented as a PWB resonator, the incremental cost of including this filter on the PWB is relatively small.

20 Claims, 4 Drawing Sheets

TRANSMISSION LINE COMMON-MODE FILTER

BACKGROUND OF THE INVENTION

1. Field of the Invention

Embodiments of the present invention relate generally to the field of electronic devices and more specifically to a technique for reducing common mode noise in differential signal interconnect.

2. Description of the Related Art

High performance electronic devices employ differential signals to transfer data at very high speeds through printed wiring board ("PWB") interconnect between integrated circuit devices. However, one side effect of these high speed transfers is that electro-magnetic interference ("EMI") may be created as a result of distortions of the high speed signals. This EMI may interfere with other nearby electronic devices. In order to reduce such interference, the government strictly regulates the amount of EMI that may be legally emitted from electronic devices, forcing manufacturers to limit the amount of EMI emitted from their products.

Signals in an ideal differential pair are designed to be of the same magnitude and out of the phase. Thus, the electromagnetic field generated by each interconnect within the ideal differential pair is canceled, and EMI is minimized. However, in a real word, common-mode signals are inevitably present because of imbalances in a differential pair and because of external noises injected into a differential pair, etc. EMI may be increased substantially from differential signal PWB interconnects when common-mode signals are present. Since these common-mode signals do not contribute to data signals transmitted between integrated circuit devices, filtering the common-mode signals without distorting the differential signals for the data is a desirable technique for reducing EMI.

Existing electronic devices transferring data through single-ended signal PWB interconnects employ filters to reduce noise from the data signals. One form of such filtering employs a resonator constructed from one or more of the PWB interconnects. By placing the resonator adjacent to the PWB interconnect, the resonator is able to filter the unwanted frequencies being transmitted within the PWB interconnect. Since techniques for designing a PWB resonator to filter specific frequencies is well known to those skilled in the art, designing PWB resonators to filter these additional frequencies from a PWB interconnect is not discussed herein.

One drawback of this approach is that filtering additional frequencies from both signals in a differential signal pair by using resonators located on opposite sides of the PWB interconnects that carry the differential signals may distort one signal relative to the other signal. This distortion arises from small differences in the filtering characteristics of each resonator and may lead to substantial voltage differences between the signals. Since differential signaling communicates data through small voltage differences between the signals, any resonator-induced distortion of one signal relative to the other may distort the data carried by those signals. Thus, such filtering may increase the error rate in that differential signal pair.

As the foregoing illustrates, what is needed in the art is a way to filter unwanted common-mode signals in a differential signal pair that avoids one or more of the disadvantages set forth above.

SUMMARY OF THE INVENTION

One embodiment of the present invention sets forth a system for removing unwanted common-mode noise from a differential signal. The system includes a transmitting device, a receiving device, a first interconnect coupling the positive signal from the transmitting device to the receiving device, a second interconnect coupling the negative signal from the transmitting device to the receiving device, where the first interconnect and the second interconnect are designed in a substantially same manner to maintain the balance between the first interconnected and the second interconnect, and a resonator disposed in between the first interconnect and the second interconnect such that a distance between the first interconnect and the resonator is substantially the same as a distance between the resonator and the second interconnect. Importantly, the resonator is configured to reduce certain common-mode noise at specific frequencies from both a first signal carried by the first interconnect and a second signal carried by the second interconnect without distorting the first signal relative to the second signal or the second signal relative to the first signal.

One advantage of the disclosed system is that common-mode filtering is employed, so the resonator reduces common-mode noise at specific frequencies without distorting the information-carrying voltage difference between the differential signals. Further, since the system is implemented as a PWB resonator, the incremental cost of including this type of filter on the PWB is relatively small.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Filtering both signals in a differential signal pair with a common filter characteristic reduces unwanted common-mode noise at specific frequencies from the differential signals without distorting one signal relative to the other signal. In a differential signal pair constructed from a pair of PWB interconnects, configuring both PWB interconnects to include a resonator that is located parallel to and spaced equally between the PWB interconnects filters the common-mode noise on both PWB interconnects with a common filter characteristic. As is well known, the filter characteristics of a resonator are determined by the physical characteristics (e.g., length and dielectric constant) of the resonator, and the spacing between the resonator and the PWB interconnect. Equally spacing a single resonator between two PWB interconnects of the same length and width filters both interconnects with the common filter characteristic of that resonator. Therefore, including a resonator that is equally spaced between the PWB interconnects of a differential signal pair reduces the unwanted common-mode noise at specific frequencies from the signals in both PWB interconnects without distorting a signal in one PWB interconnect relative to a signal in the other PWB interconnect.

Figure 1:
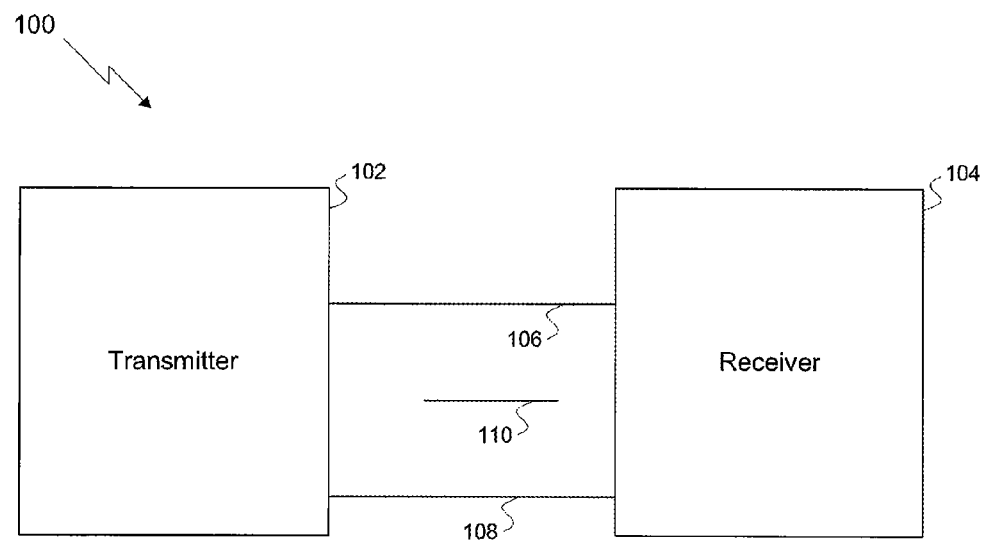
FIG. 1 illustrates a resonator configured to reduce unwanted common-mode noise at specific frequencies from a differential signal, according to one embodiment of the invention.

FIG. 1 illustrates an electronic device 100 that includes a resonator 110 configured to reduce unwanted common-mode noise at specific frequencies from a differential signal carried by PWB interconnects 106 and 108, according to one embodiment of the invention. As shown, the electronic device 100 includes a transmitter 102, a receiver 104, a PWB interconnects 106 and 108 for carrying differential signals, and a resonator 110. Importantly, the physical characteristics of the PWB interconnects 106, 108, such as their length and width, substantially match. Additionally, the spacing between the resonator 110 and the PWB interconnect 106 substantially matches the spacing between the resonator 110 and the PWB interconnect 108. Therefore, as previously described, the filter characteristics of the resonator 110 are common to the PWB interconnects 106, 108. Further, as previously described herein, the resonator 110 is configured to reduce the unwanted common-mode noise at specific frequencies from signals in both PWB interconnects 106, 108 without distorting the differential signal.

In another embodiment of the invention, a discrete capacitor may be designed in the resonator so that the resonant frequency of the resonator can be adjusted after the PWB and the relevant interconnects have been manufactured. As is well-known, adding a discrete capacitor to a resonator changes the effective length of the resonator, thereby changing the resonant frequency of the resonator. Adjusting the resonant frequency of a resonator is desirable because the resonant frequency can be matched to the frequencies that are determined, through laboratory testing, for example, to generate EMI. In this fashion, the EMI emissions generated by an electronic device can be reduced.

Figure 2:
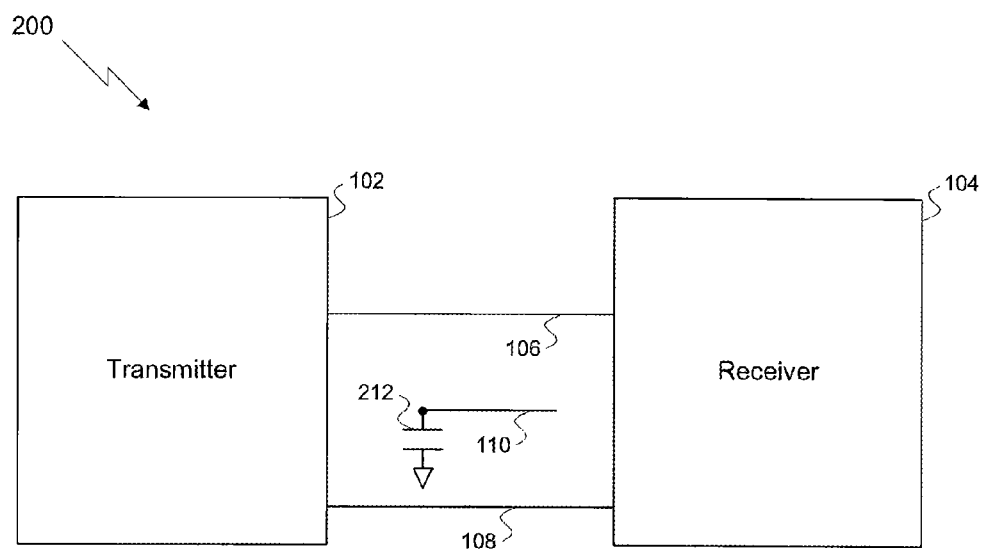
FIG. 2 illustrates the resonator of FIG. 1 that includes a discrete capacitor, for adjusting the resonant frequency of the resonator, according to one embodiment of the invention.

FIG. 2 illustrates an electronic device 200 that includes the resonator 110 of FIG. 1 connected to a discrete capacitor 212, according to one embodiment of the invention. As shown, the electronic device 200 includes the transmitter 102, the receiver 104, the PWB interconnects 106 and 108 for carrying a differential signal, the resonator 110, and the discrete capacitor 212. In one embodiment of the invention, the capacitor may be a discrete capacitor that is soldered onto the PWB. In other embodiments of the invention, any technically feasible means of adding capacitance to the resonator 110 may be used to adjust the resonant frequency of the resonator without departing from the scope of the invention. Importantly, and as previously described, the added capacitance enables the resonant frequency of the resonator 110 to be adjusted, thereby the common-mode noise at specific frequencies that the resonator 110 reduces from the differential signal carried by PWB interconnects 106 and 108.

In yet-another embodiment of the invention, as described below in FIG. 3, a plurality of resonators with different resonant frequencies may equally spaced between the PWB interconnects of a differential signal pair. In this embodiment, the resonant frequencies of the resonators are configured to cooperatively reduce common-mode noise at a much wider band of frequencies from the differential signal than the single resonator of FIG. 1 is able to reduce. Again, since the spacing between each resonator and a first PWB interconnect matches the spacing between each resonator and a second PWB interconnect, the resonators reduce the unwanted common-mode noise at specific frequencies from signals in both PWB interconnects without distorting the differential signal in the PWB interconnects 106, 108.

Figure 3:
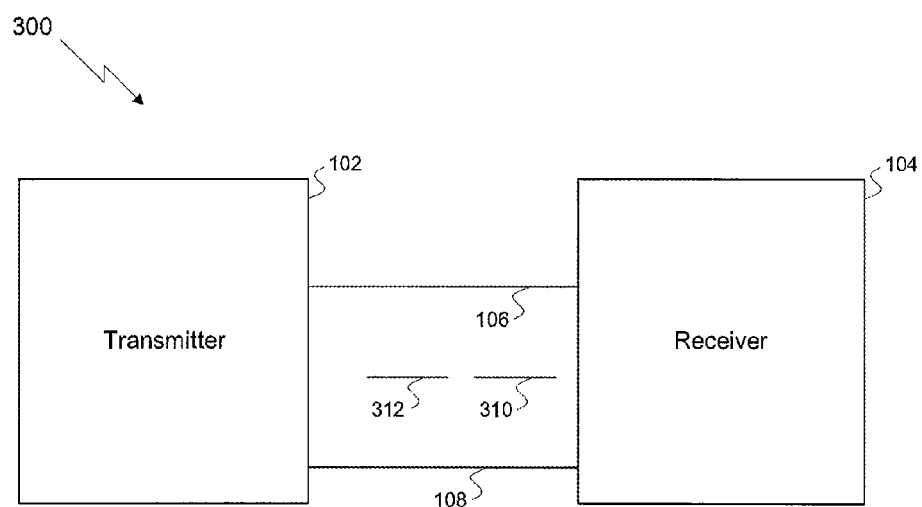
FIG. 3 illustrates a system with two resonators configured to reduce a band of unwanted common-mode noise at specific frequencies in a differential signal, according to one embodiment of the invention.

FIG. 3 illustrates an electronic device 300 configured to include two resonators 310, 312 configured to reduce unwanted common-mode noise at a band of specific frequencies from a differential signal carried by PWB interconnects 106, 108, according to one embodiment of the invention. As shown, the electronic device 300 includes the transmitter 102, the receiver 104, the PWB interconnects 106 and 108 for carrying a differential signal, the first resonator 310 and the second resonator 312.

Figure 4A:
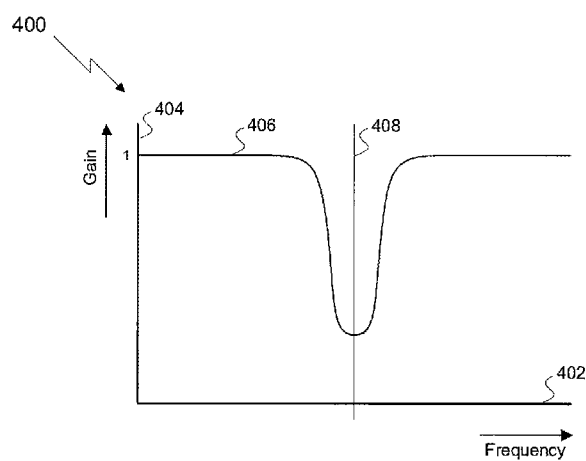
FIG. 4A illustrates a transfer characteristic of the resonator of FIG. 1.

FIG. 4A illustrates a transfer characteristic 400 of the resonator 110 of FIG. 1 that includes a frequency axis 402, a common-mode gain axis 404, a frequency response 406, and a resonant frequency 408. Importantly, the common-mode gain of the filter is at a minimum at the resonant frequency 408, indicating the common-mode noise at the specific frequencies that the resonator 110 is configured to reduce from a differential signal.

Figure 4B:
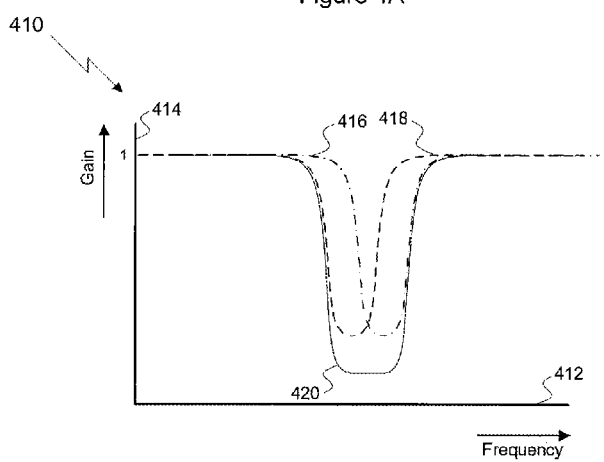
FIG. 4B illustrates a transfer characteristic of the two resonators of FIG. 3.

FIG. 4B illustrates a transfer characteristic 410 of the resonators 310, 312 of FIG. 3 that includes a frequency axis 412, a common-mode gain axis 414, a first frequency response 416 corresponding to the first resonator 310, a second frequency response 418 corresponding to the second resonator 312, and a combined frequency response 420. Importantly, the resonant frequencies of the resonators 310, 312 cooperatively reduce common-mode noise at a band of frequencies, based on the partially-overlapping frequency responses 416, 418. Again, the frequencies for which the combined frequency response is minimized indicate the common-mode noise at specific frequencies that resonators 310 and 312 are configured to reduce from a differential signal.

Figure 5:
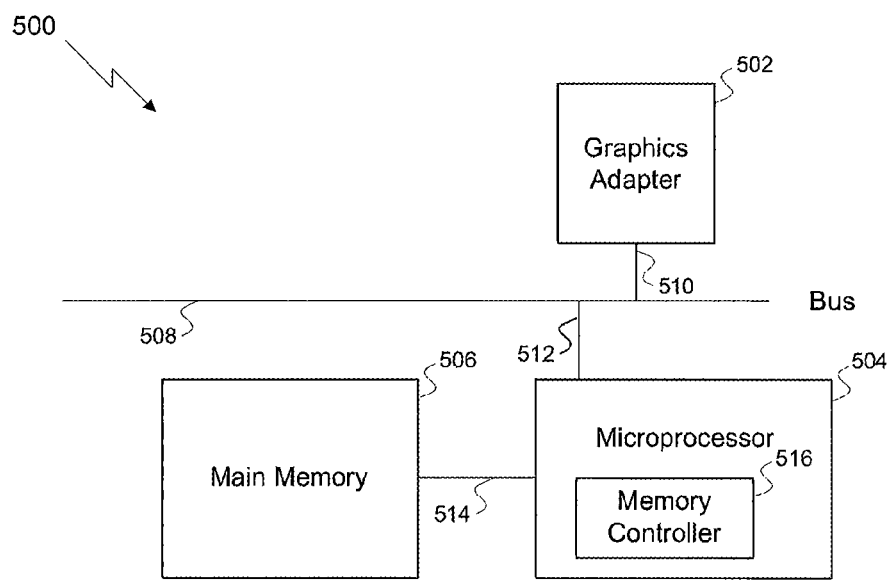
FIG. 5 illustrates an electronic device in which one or more aspects of the invention may be implemented.

FIG. 5 illustrates an electronic device 500 in which one or more aspects of the invention may be implemented. As shown, the electronic device 500 includes a graphics adapter 502, a main memory 506, a bus 508, and a microprocessor 504, which includes a memory controller 516. The bus 508 is coupled to the graphics adapter 502 and the microprocessor 504 through interfaces 510 and 512, respectively, and the main memory 506 is coupled to the microprocessor 504 through a memory interface 514. Importantly, the bus 508, the interfaces 510 and 512 and/or other interfaces in the electronic device 500 may include one or more PWB interconnects that transmit differential signals and incorporate one or more resonators to filter unwanted common-mode frequencies, as previously described.

One advantage of the disclosed resonator designs is that unwanted common-mode noise at specific frequencies may be reduced from differential signals carried in PWB interconnects by equally spacing one or more resonators between the PWB interconnects without distorting the differential signal in the PWB interconnects. Further, since each resonator is implemented as a PWB resonator, the incremental cost of removing the unwanted common-mode frequencies is very small.

While the foregoing is directed to embodiments of the present invention, other and further embodiments of the invention may be devised without departing from the basic scope thereof. For example, the resonator systems disclosed herein may be implemented in any type of printed wiring board structure, whether the interconnects are substantially aligned in a horizontal fashion on the same printed wiring board layer or in a vertical fashion through a plurality of printed wiring board layers. The scope of the present invention is therefore determined by the claims that follow.

We claim:

1. A system for reducing unwanted high frequency noise from a differential interface, the system comprising:
   a transmitting device;
   a receiving device;
   a first interconnect coupling the transmitting device to the receiving device, wherein a first end of the first interconnect is connected to the transmitting device and a second end of the first interconnect is connected to the receiving device;
   a second interconnect coupling the transmitting device to the receiving device, wherein a first end of the second interconnect is connected to the transmitting device and a second end of the second interconnect is connected to the receiving device, wherein the first interconnect and the second interconnect are parallel to one another, and wherein the first interconnect and second interconnect do not intersect with one another; and
   a resonator disposed in between the first interconnect and the second interconnect such that a distance between the first interconnect and the resonator is substantially equal to the distance between the resonator and the second interconnect,
   wherein the resonator is configured to reduce certain common-mode noise at specific frequencies from both a first signal carried by the first interconnect and a second signal carried by the second interconnect without distorting the first signal relative to the second signal or the second signal relative to the first signal.

2. The system of claim 1, wherein the length and width of the first interconnect are substantially equal to the length and the width of the second interconnect.

3. The system of claim 2, wherein the transmitting device, the receiving device, the first interconnect, the second interconnect and the resonator are disposed on a printed wiring board.

4. The system of claim 1, further comprising a capacitor coupled to the resonator for adjusting a resonant frequency of the resonator.

5. The system of claim 4, wherein the length and width of the first interconnect are substantially equal to the length and the width of the second interconnect.

6. The system of claim 5, wherein the transmitting device, the receiving device, the first interconnect, the second interconnect and the resonator are disposed on a printed wiring board, and the capacitor is soldered to the printed wiring board.

7. The system of claim 1, further comprising a second resonator disposed proximate to the resonator and in between the first interconnect and the second interconnect such that a distance between the first interconnect and the second resonator is substantially equal to the distance between the second resonator and the second interconnect.

8. The system of claim 7, wherein the second resonator and the first resonator are configured to reduce common-mode noise at a certain band of frequencies from both a first signal carried by the first interconnect and a second signal carried by the second interconnect without distorting the first signal relative to the second signal or the second signal relative to the first signal.

9. The system of claim 8, wherein the length and width of the first interconnect are substantially equal to the length and the width of the second interconnect.

10. The system of claim 9, wherein the transmitting device, the receiving device, the first interconnect, the second interconnect, the resonator, and the second resonator are disposed on a printed wiring board.

11. An electronic device, comprising:
    a memory;
    a processing unit; and
    a bus coupling the memory to the processing unit and including:
      a first interconnect and a second interconnect that are parallel to one another, and wherein the first interconnect and second interconnect do not intersect with one another,
      wherein the first interconnect couples the memory to the processing unit, and wherein a first end of the first interconnect is connected to the transmitting device and a second end of the first interconnect is connected to the receiving device, and
      wherein the second interconnect couples the memory to the processing unit, and wherein a first end of the second interconnect is connected to the transmitting device and a second end of the second interconnect is connected to the receiving device, and
      a resonator disposed in between the first interconnect and the second interconnect such that a distance between the first interconnect and the resonator is substantially equal to the distance between the resonator and the second interconnect,
      wherein the resonator is configured to reduce certain common-mode noise at specific frequencies from both a first signal carried by the first interconnect and a second signal carried by the second interconnect without distorting the first signal relative to the second signal or the second signal relative to the first signal.

12. The electronic device of claim 11, wherein the length and width of the first interconnect are substantially equal to the length and the width of the second interconnect.

13. The electronic device of claim 12, wherein the memory, the processing unit, the first interconnect, the second interconnect and the resonator are disposed on a printed wiring board.

14. The electronic device of claim 11, further comprising a capacitor coupled to resonator for adjusting a resonant frequency of the resonator.

15. The electronic device of claim 14, wherein the length and width of the first interconnect are substantially equal to the length and the width of the second interconnect.

16. The electronic device of claim 15, wherein the memory, the processing unit, the first interconnect, the second interconnect and the resonator are disposed on a printed wiring board, and the capacitor is soldered to the printed wiring board.

17. The electronic device of claim 11, further comprising a second resonator disposed proximate to the resonator and in between the first interconnect and the second interconnect such that a distance between the first interconnect and the second resonator is substantially equal to the distance between the second resonator and the second interconnect.

18. The electronic device of claim 17, wherein the second resonator and the first resonator are configured to reduce common-mode noise at a certain band of frequencies from both a first signal carried by the first interconnect and a second signal carried by the second interconnect without distorting the first signal relative to the second signal or the second signal relative to the first signal.

19. The electronic device of claim 18, wherein the length and width of the first interconnect are substantially equal to the length and the width of the second interconnect.

20. The electronic device of claim 19, wherein the memory, the processing unit, the first interconnect, the second interconnect, the resonator, and the second resonator are disposed on a printed wiring board.

* * * * *